(12) United States Patent
Tsai et al.

(10) Patent No.: US 11,488,920 B2
(45) Date of Patent: Nov. 1, 2022

(54) SILVER NANO-TWINNED THIN FILM STRUCTURE AND METHOD FOR FORMING THE SAME

(71) Applicant: AG MATERIALS TECHNOLOGY CO., LTD., Hsinchu (TW)

(72) Inventors: Hsing-Hua Tsai, Hsinchu (TW); An-Chi Chuang, Hsinchu (TW); Po-Ching Wu, Hsinchu (TW); Chung-Hsin Chou, Hsinchu (TW)

(73) Assignee: AG MATERIALS TECHNOLOGY CO., LTD., Hsinchu (TW)

( * ) Notice: Subject to any disclaimer, the term of this patent is extended or adjusted under 35 U.S.C. 154(b) by 6 days.

(21) Appl. No.: 16/844,972

(22) Filed: Apr. 9, 2020

(65) Prior Publication Data

US 2021/0225793 A1   Jul. 22, 2021

(30) Foreign Application Priority Data

Jan. 21, 2020   (TW) ................. 109102062

(51) Int. Cl.
H01L 23/00        (2006.01)

(52) U.S. Cl.
CPC .............. *H01L 24/29* (2013.01); *H01L 24/27* (2013.01); *H01L 2224/2745* (2013.01); *H01L 2224/29083* (2013.01); *H01L 2224/29124* (2013.01); *H01L 2224/29147* (2013.01); *H01L 2224/29155* (2013.01); *H01L 2224/29166* (2013.01); *H01L 2224/29239* (2013.01); *H01L 2924/10253* (2013.01); *H01L 2924/10272* (2013.01); *H01L 2924/10329* (2013.01); *H01L 2924/15788* (2013.01); *H01L 2924/35121* (2013.01)

(58) Field of Classification Search
CPC ......... H01L 29/66795; H01L 29/41791; H01L 2224/05639; H01L 2924/00014; H01L 2224/05166; H01L 2224/05124; H01L 2224/05073; H01L 2224/05082; H01L 2224/05155; H01L 2224/05147; H01L 21/823814; H01L 29/7848; H01L 29/66545; H01L 21/823807
See application file for complete search history.

(56) References Cited

U.S. PATENT DOCUMENTS

| | | | |
|---|---|---|---|
| 2014/0294651 A1* | 10/2014 | Roy ..................... | C22F 1/10 419/5 |
| 2015/0233019 A1* | 8/2015 | Zhang ................. | C23C 14/165 428/612 |

FOREIGN PATENT DOCUMENTS

| | | |
|---|---|---|
| TW | 201540861 | 11/2015 |
| TW | 201604293 | 2/2016 |

\* cited by examiner

*Primary Examiner* — Julio J Maldonado
*Assistant Examiner* — Stanetta D Isaac

(57) ABSTRACT

A silver nano-twinned thin film structure and a method for forming the same are provided. A silver nano-twinned thin film structure, including: a substrate; an adhesive-lattice-buffer layer over the substrate; and a silver nano-twinned thin film over the adhesive-lattice-buffer layer, wherein the silver nano-twinned thin film comprises parallel-arranged twin boundaries, and a cross-section of the silver nano-twinned thin film reveals that 50% or more of all twin boundaries are parallel-arranged twin boundaries, wherein the parallel-arranged twin boundaries include Σ3 and Σ9 boundaries, wherein the Σ3 and Σ9 boundaries include 95% or more crystal orientation.

15 Claims, 8 Drawing Sheets

SILVER NANO-TWINNED THIN FILM STRUCTURE AND METHOD FOR FORMING THE SAME

CROSS-REFERENCE TO RELATED APPLICATIONS

The present application claims priority of Taiwan Application No. 109102062, filed on Jan. 21, 2020, which is incorporated by reference herein in its entirety.

BACKGROUND

Technical Field

The disclosure relates to a thin film structure and a method for forming the same, and more particularly to a silver nano-twinned thin film structure and a method for forming the same.

Description of the Related Art

Most conventional metal thin film structures are equi-axial grains with grain sizes of several microns or more. U.S. Patent Publication No. US20150275350A1 discloses a structure of silver or silver alloy nano-twinned thin film sputtered directly on the silicon substrate. The silver or silver alloy nano-twinned thin film has better tensile strength and conductivity than ordinary grains or nano equi-axial grains. However, the silver or silver alloy nano-twinned thin film has a very weak bonding force when bonded to the silicon substrate, which can easily result in peeling.

Taiwan Patent No. 1419985 discloses a method for forming copper, nickel, silver or gold on a silicon oxide substrate by plating. The metal thin film is then bombarded with ions to form mechanical twins. The distance between twin boundaries is between 8.3 nm and 45.6 nm. Although the nano-twinned thin film can improve the electromigration resistance and hardness, the crystal orientation distribution is disordered, which adversely affects the overall reliability of the thin film. A weak bonding force between the silicon substrate and the nano-twinned thin film may also result in peeling.

Taiwan Patent No. 1432613 discloses a method for forming a copper nano-twinned thin film by plating. Taiwan Patent No. 1521104 discloses a method for plating a copper seed layer and then plating nickel nano-twinned thin film. Taiwan Patent No. 1507548 discloses a method for forming a gold nano-twinned thin film by plating. These conventional techniques can form a large number of parallel-arranged nano-twinned thin films on a substrate. However, they all use a high-speed rotary plating method at a speed of 50 rpm or even 1500 rpm, which makes it difficult to control the process and film quality. The resulting distance between parallel-arranged twin boundaries is large, and it comprises only 90% or even 50% [111] crystal orientation. In addition, the electroplating waste produced by the electroplating process also has environmental concerns. As a nano-twinned thin film is directly plated on a silicon substrate, the bonding force between the silicon substrate and the nano-twinned thin film is weak, which may also cause peeling.

In view of the various disadvantages of the conventional metal films and techniques, the semiconductor industry still faces challenges in low-temperature and low-pressure wafer bonding and 3D-IC flip-chip assembly.

SUMMARY

Some embodiments of the present disclosure provide a silver nano-twinned thin film structure, including: a substrate; an adhesive-lattice-buffer layer over the substrate; and a silver nano-twinned thin film over the adhesive-lattice-buffer layer, wherein the silver nano-twinned thin film includes parallel-arranged twin boundaries, and a cross-section of the silver nano-twinned thin film reveals that 50% or more of all twin boundaries are parallel-arranged twin boundaries, wherein the parallel-arranged twin boundaries include Σ3 and Σ9 boundaries, wherein the Σ3 and Σ9 boundaries include 95% or more [111] crystal orientation.

Some embodiments of the present disclosure provide a method for forming a silver nano-twinned thin film structure, including: forming an adhesive-lattice-buffer layer on a substrate; and forming a silver nano-twinned thin film on the adhesive-lattice-buffer layer, wherein the silver nano-twinned thin film includes parallel-arranged twin boundaries, and a cross-section of the silver nano-twinned thin film reveals that 50% or more of all twin boundaries are parallel-arranged twin boundaries, wherein the parallel-arranged twin boundaries include Σ3 and Σ9 boundaries, wherein the Σ3 and Σ9 boundaries include 95% or more [111] crystal orientation.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1A:
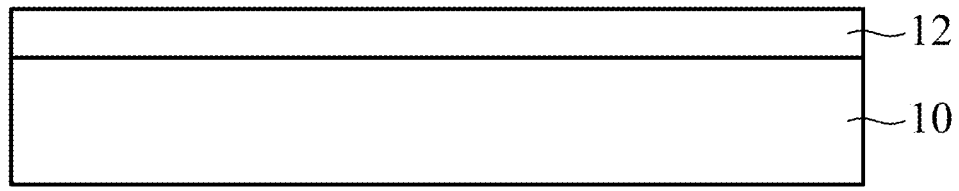
FIGS. 1A and 1B are cross-sectional views of a silver nano-twinned thin film structure at different stages for forming the same according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Some variations of embodiments are described below. In different figures and illustrated embodiments, similar element symbols are used to indicate similar elements. It is appreciated that additional operations can be provided before, during, and/or after the stages described in these embodiments. Some of the stages that are described can be replaced or eliminated for different embodiments.

Furthermore, spatially relative terms, such as "beneath," "below," "lower," "overlapped," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The term "substantially" in the description, such as in "substantially peeling" will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%.

Embodiments of the present disclosure provide a silver nano-twinned thin film structure, including a substrate, an adhesive-lattice-buffer layer over the substrate, and a silver nano-twinned thin film over the adhesive-lattice-buffer layer. The adhesive-lattice-buffer layer enhances the bonding force between the substrate and the silver nano-twinned thin film. In addition, the adhesive-lattice-buffer layer may reduce the influence of the crystal orientation of the substrate on the silver nano-twinned thin film. In a cross-sectional view of the silver nano-twinned thin film, the silver nano-twinned thin film includes parallel-arranged twin boundaries, and a cross-section of the silver nano-twinned thin film reveals that 50% or more of all twin boundaries are parallel-arranged twin boundaries. The parallel-arranged twin boundaries include 95% or more [111] crystal orientation. In addition to the characteristics of silver itself, the characteristics of the twin structure, such as better resistance to oxidation, resistance to corrosion, electrical conductivity, thermal conductivity, and high temperature stability, etc., make the silver nano-twinned thin film structure according to the embodiments of the present disclosure more applicable in the semiconductor industry such as low-temperature and low-pressure wafer bonding and 3D-IC flip-chip assembly.

Figure 1B:
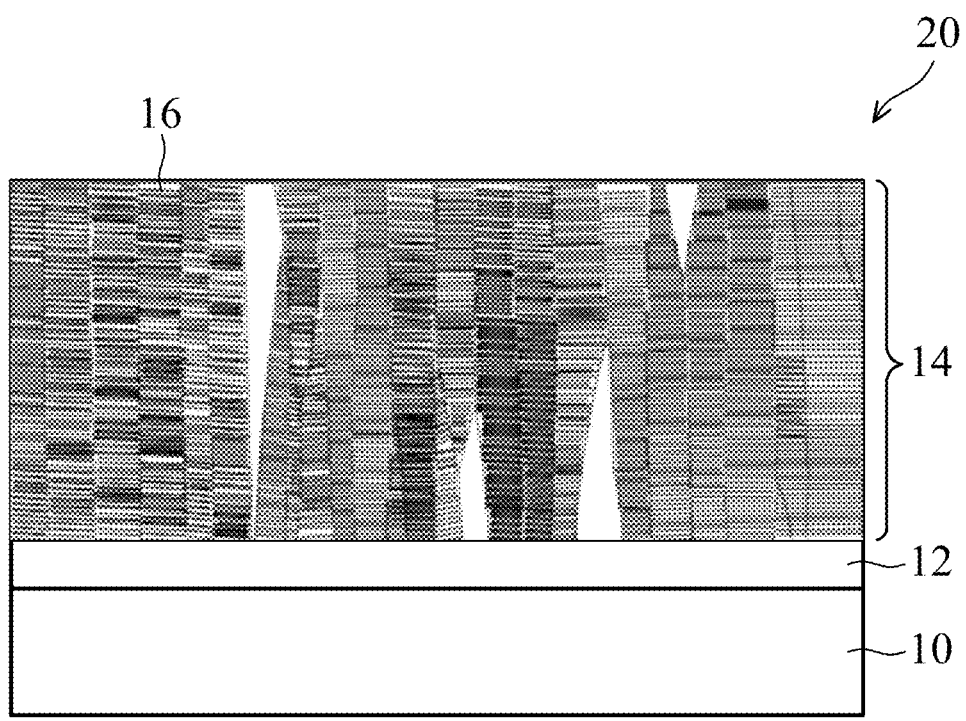

In accordance with some embodiments, FIGS. 1A and 1B illustrate cross-sectional views of a silver nano-twinned thin film structure 20 at different stages for forming the same.

Referring to FIG. 1A, an adhesive-lattice-buffer layer 12 is formed on a substrate 10. The adhesive-lattice-buffer layer 12 improves the bonding force between the substrate 10 and the silver nano-twinned thin film 14 and also has a lattice buffering effect on forming the silver nano-twinned thin film 14 on the substrate 10. In some embodiments, the substrate 10 includes a single-crystalline silicon substrate, polycrystalline silicon substrate, SiC substrate, GaAs substrate, or glass substrate. In some embodiments, the single-crystalline silicon substrate includes (100), (110), or (111) crystal orientation.

In some embodiments, the adhesive-lattice-buffer layer 12 may include Ti, Al, or a combination thereof. In some embodiments, the thickness of the Ti-containing adhesive-lattice-buffer layer 12 may be 0.01 μm to 1 μm such as 0.1 μm to 0.5 μm. In some embodiments, the thickness of the Al-containing adhesive-lattice-buffer layer 12 may be 0.01 μm to 1 μm, such as 0.1 μm to 0.5 μm. It should be understood that the thickness of the adhesive-lattice-buffer layer 12 may be appropriately adjusted according to practical applications, and is not intended to be limiting.

In some embodiments, as shown in FIG. 1A, the adhesive-lattice-buffer layer 12 may be formed on the substrate 10 by sputtering. In some embodiments, the sputtering may use single sputtering gun or multiple sputtering guns. In the sputtering process, the power source may be DC, DC plus, RF, or high-power impulse magnetron sputtering (HIPIMS). The power may be, for example, 50 W to 3000 W. The processing temperature may be, for example, −5° C. to 55° C. The deposition rate of the Ti-containing adhesive-lattice-buffer layer 12 may be, for example, 0.01 nm/s to 1 nm/s; the deposition rate of the Al-containing adhesive-lattice-buffer layer 12 may be, for example, 0.01 nm/s to 5 nm/s. The argon working pressure may be, for example, $10^{-3}$ torr to $10^{-2}$ torr. The rotation speed of the chuck may be, for example, 1 rpm to 100 rpm. It should be understood that the sputtering process parameters described above may be appropriately adjusted according to practical applications, and are not intended to be limiting.

In accordance with other embodiments, as shown in FIG. 1A, the adhesive-lattice-buffer layer 12 may be formed on the substrate 10 by evaporation coating. In some embodiments, the degree of vacuum of the evaporation coating process may be, for example, $10^{-6}$ torr to $10^{-5}$ torr. The electron beam scanning frequency may be, for example, about 2 Hz. The evaporation coating rate of the Ti-containing adhesive-lattice-buffer layer 12 may be, for example, 0.01 nm/s to 2 nm/s; the evaporation coating rate of the Al-containing adhesive-lattice-buffer layer 12 may be, for example, 0.01 nm/s to 10 nm/s. It should be understood that the evaporation coating process parameters described above may be appropriately adjusted according to practical applications, and are not intended to be limiting.

Referring to FIG. 1B, a silver nano-twinned thin film 14 is formed on the adhesive-lattice-buffer layer 12. In some embodiments, the silver nano-twinned thin film 14 includes nano-scale parallel-arranged twin boundaries (Σ3+Σ9), and a distance between the nano-scale parallel-arranged twin boundaries may be, for example, 1 nm to 100 nm. A cross-section of the silver nano-twinned thin film reveals that 50% or more of all twin boundaries are parallel-arranged twin boundaries. The parallel-arranged twin boundaries include 95% or more [111] crystal orientation.

In accordance with some embodiments, as shown in FIG. 1B, the silver nano-twinned thin film 14 includes parallel-stacked silver nano-twinned pillars 16. In some embodiments, the thickness of the silver nano-twinned thin film 14 may be 0.1 μm to 100 μm, such as 0.5 μm to 20 μm. In some embodiments, diameters of the silver nano-twinned pillars 16 may be 0.01 μm to 100 μm, such as 0.3 μm to 0.5 μm. It should be understood that the thickness of the silver nano-twinned thin film 14 and the diameters of the silver nano-twinned pillars 16 may be appropriately adjusted according to practical applications, and are not intended to be limiting.

In accordance with some embodiments, as shown in FIG. 1B, the silver nano-twinned thin film 14 may be formed on the adhesive-lattice-buffer layer 12 by sputtering. In some embodiments, the sputtering may use single sputtering gun or multiple sputtering guns. In the sputtering process, the power source may be DC, DC plus, RF, or HIPIMS. The power may be, for example, 50 W to 3000 W. The processing temperature may be, for example, −5° C. to 55° C. The argon working pressure may be, for example, $10^{-3}$ torr to $10^{-2}$ torr. The rotation speed of the chuck may be, for example, 1 rpm to 100 rpm. The deposition rate of the silver nano-twinned thin film 14 may be, for example, 0.3 nm/s to 15 nm/s. It should be understood that the sputtering process parameters described above may be appropriately adjusted according to practical applications, and are not intended to be limiting.

In accordance with other embodiments, as shown in FIG. 1B, the silver nano-twinned thin film 14 may be formed on the adhesive-lattice-buffer layer 12 by evaporation coating. In some embodiments, the degree of vacuum of the evaporation coating process may be, for example, $10^{-6}$ torr to $10^{-5}$ torr. The electron beam scanning frequency may be, for example, about 2 Hz. The evaporation coating rate of the silver nano-twinned thin film 14 may be, for example, 0.5 nm/s to 20 nm/s. It should be understood that the evaporation coating process parameters described above may be appropriately adjusted according to practical applications, and are not intended to be limiting.

In the prior art, silver nano-twin thin films are directly sputtered on (111) and (110) substrates (D. Bufford, H. Wang, and X. Zhang, High Strength Epitaxial Nano-Twinned Ag Films, Acta Materialia, 59, 2011, pp. 93-101). However, due to the insufficient bonding force between the silver nano-twinned thin films and the substrates, the thickness of the silver nano-twinned thin films may only reach about 2 μm as the silver nano-twinned thin films are directly sputtered on the substrates. In accordance with some embodiments of the present disclosure, the adhesive-lattice-buffer layer 12 can improve the bonding force between the metal film layer formed subsequently and the substrate to avoid peeling.

In the prior art, the crystal orientation of a substrate will affect the twin density of a deposited silver nano-twinned thin film as the silver or silver alloy nano-twinned thin film is directly deposited on the substrate. According to Bufford et al., the silver nano-twinned thin film with high twin density can be obtained only when the silver nano-twinned thin film is sputtered on the (111) substrate. The silver nano-twinned thin film deposited on the (110) substrate has a very low twin density. Moreover, the twin boundaries may further distort from the direction of growth of the thin film by up to 60°.

In the prior art, the crystal orientation of a substrate will affect the thin film formed thereon. For example, a (111) thin film is not easily formed on a (100) substrate. In comparison, according to some embodiments of the present disclosure, the adhesive-lattice-buffer layer 12 has the lattice buffering effect on forming the silver nano-twinned thin film 14 on the substrate 10 with different crystal orientation. The inventors of the present disclosure surprisingly found that whether the silver nano-twinned thin films 14 are formed on the (100), (110), or (111) substrate 10, all of them have high twin densities. In addition, whether the densely parallel-arranged nano twins are formed on the (100), (110), or (111) substrate 10, all of them exhibit a [111] crystal orientation close to 100%. Furthermore, the twin boundaries are perpendicular to the direction of growth of the silver nano-twinned thin film 14. Compared to Bufford et al., where the silver nano-twinned thin film with high twin density is only grown on the (111) substrate, the silver nano-twinned thin film structure provided by the embodiments of the present disclosure may have wider applications.

In accordance with some embodiments, the adhesive-lattice-buffer layer 12 may reduce the influence of the crystal orientation of the substrate on the crystal orientation of the nano-twinned thin film deposited subsequently. The (111) silver nano-twinned thin film 14 may be formed not only on the (100), (110), or (111) substrate 10, but also on other substrates, such as polycrystalline silicon, SiC, GaAs, or glass. Therefore, the (111) silver nano-twinned thin film may be formed on other substrates, such as polycrystalline silicon, SiC, GaAs, or glass by sputtering or evaporation coating.

The formation of twins is due to the accumulated strain energy inside a material. The strain energy drives uniform atomic shear to unsheared atoms at some regions inside the grain to form lattice positions that are mirror-symmetrical to each other. Twins include annealing twins and mechanical twins. The mutually symmetrical interface is the twin boundary.

Twins are mainly formed in face centered cubic (FCC) or hexagonal closed-packed (HCP) crystalline materials with the closest lattice arrangement. In addition to the crystal structure with the closest lattice arrangement, twins are more likely formed in materials with small stacking fault energy. For example, aluminum is a FCC crystal material, but its stacking fault energy is about 200 erg/cm². Therefore, twins are rarely formed in aluminum.

Twin boundaries are coherent crystal structures and are classified as Σ3 and Σ9 special grain boundaries with low interfacial energy. The crystal orientations are all {111}. Compared with high-angle grain boundaries formed by general annealing and recrystallization, the interfacial energy of twin boundaries is about 5% of the interfacial energy of high-angle grain boundaries (George E. Dieter, Mechanical Metallurgy, McGRAW-HILL Book Company, 1976, P. 135-141).

Due to the low interfacial energy of the twin boundaries, oxidation, sulfurization, and chloride ion corrosion may be avoided. Therefore, the silver nano-twinned thin film exhibits better resistance to oxidation and corrosion. In addition, the symmetrical lattice arrangement of twins is less likely to impede electron transportation. Therefore, the silver nano-twinned thin film exhibits better electrical and thermal conductivity. Because the twin boundaries inhibit the movement of dislocation, materials may still maintain high tensile strength. The characteristics of high tensile strength and electrical conductivity have been proven in the copper thin film. (See Ultrahigh Strength and High Electrical Conductivity in Copper, Science, vol. 304, 2004, p. 422-426 issued to L. Lu, Y. Shen, X. Chen, L. Qian, and K. Lu)

In an aspect of high-temperature stability, twin boundaries are more stable than high-angle grain boundaries due to the low interfacial energy of twin boundaries. Twin boundaries are less likely to move at high temperatures. Twin boundaries may have an effect on locking surrounding high-angle grain boundaries, making the high-angle grain boundaries unable to move. Therefore, the grains may not grow significantly at high temperatures, which enables the tensile strength of the material to be maintained at high temperatures.

In an aspect of current reliability, since atoms have a low diffusion rate when passing through twin boundaries with low interfacial energy, it is difficult to move atoms inside the wire at a high current density during operation of electronic devices. As such, the electromigration that often occurs when current passes through a wire is inhibited. It has been proven that twins can inhibit electromigration in copper thin film. (See Observation of Atomic Diffusion at Twin-Modified Grain Boundaries in Copper, Science, vol. 321, 2008, p. 1066-1069 issued to K. C. Chen, W. W. Wu, C. N. Liao, L. J. Chen, and K. N. Tu)

In accordance with some embodiments of the present disclosure, in the application of the semiconductor packaging process, the silver nano-twinned thin film 14 may have solid-liquid phase interfacial reactions with other packaging materials, for example, in solder reflow bonding. In order to improve the bonding force between the adhesive-lattice-buffer layer 12 and the silver nano-twinned thin film 14 and avoid metal of each layer diffusing into each other, a diffusion-barrier-reaction layer 18 may be formed between the adhesive-lattice-buffer layer 12 and the silver nano-twinned thin film 14 by sputtering or evaporation coating.

Figure 2A:
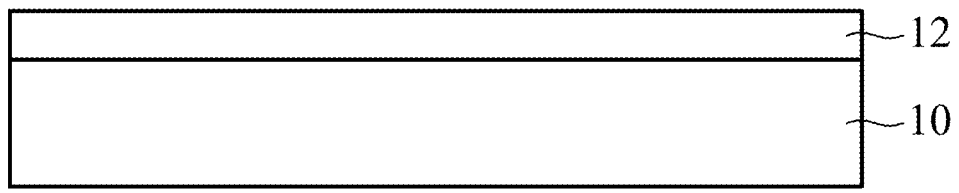
FIGS. 2A-2C are cross-sectional views of a silver nano-twinned thin film structure at different stages for forming the same according to other embodiments of the present disclosure.
Figure 2B:
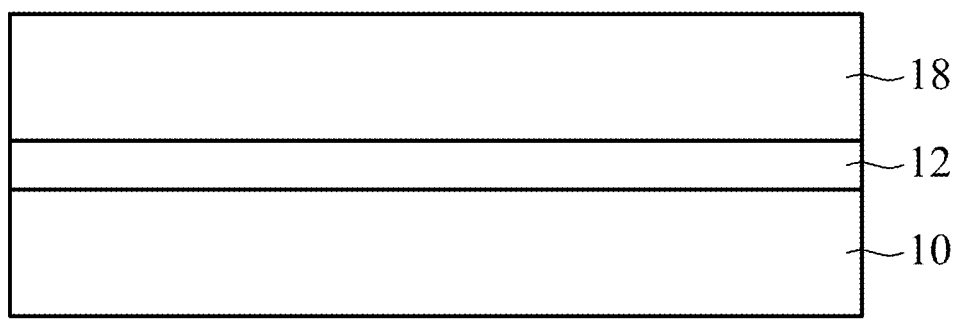
Figure 2C:
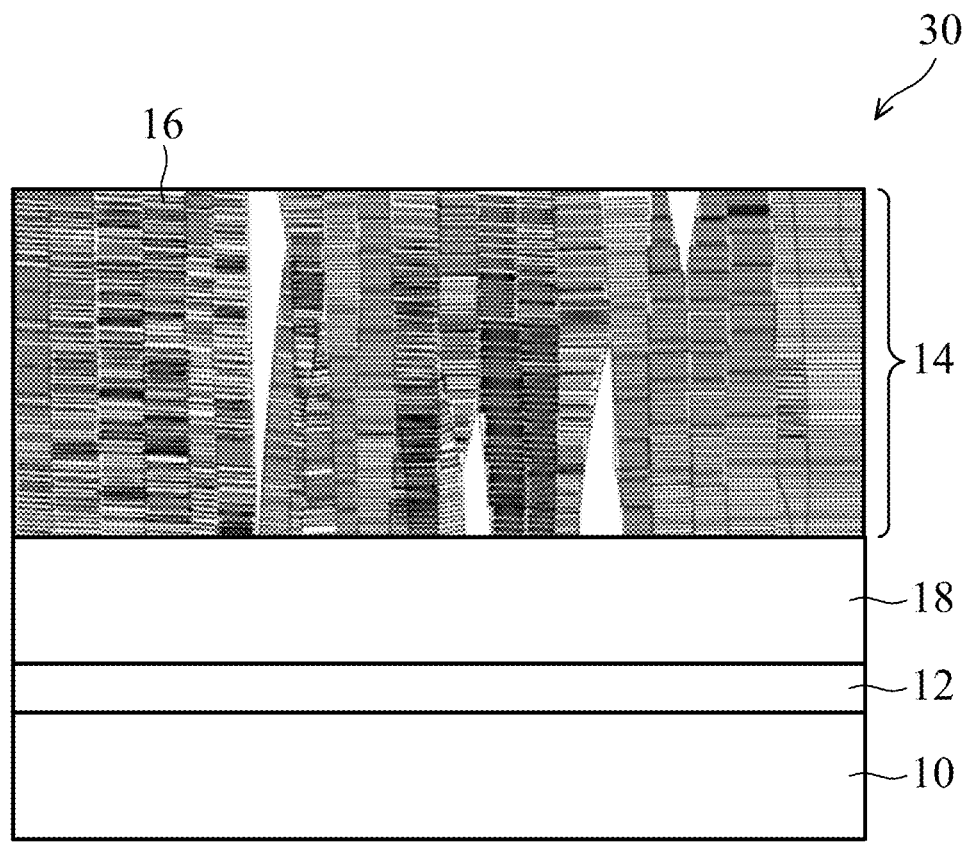

In accordance with other embodiments, FIGS. 2A-2C are cross-sectional views of a silver nano-twinned thin film structure 30 at different stages for forming the same. Compared to the embodiments shown in FIGS. 1A and 1B, the diffusion-barrier-reaction layer 18 is additionally formed between the adhesive-lattice-buffer layer 12 and the silver nano-twinned thin film 14.

Referring to FIG. 2A, in some embodiments, for the material of the substrate 10, reference may be made to the embodiment shown in FIG. 1A. Thus, it is not repeated again.

In some embodiments, for the material of the adhesive-lattice-buffer layer 12, the thickness of the Ti-containing adhesive-lattice-buffer layer 12, and the thickness of the Al-containing adhesive-lattice-buffer layer 12, reference may be made to the embodiment shown in FIG. 1A. Thus, it is not repeated again. It should be understood that the thickness of the adhesive-lattice-buffer layer 12 may be appropriately adjusted according to practical applications, and is not intended to be limiting.

In accordance with some embodiments, as shown in FIG. 2A, the adhesive-lattice-buffer layer 12 may be formed on the substrate 10 by sputtering. In some embodiments, the sputtering may use single sputtering gun or multiple sputtering guns. In the sputtering process, the power source may be DC, DC plus, RF, or HIPIMS. The power may be, for example, 50 W to 3000 W. The processing temperature may be, for example, −5° C. to 55° C. The deposition rate of the Ti-containing adhesive-lattice-buffer layer 12 may be, for example, 0.01 nm/s to 1 nm/s; the deposition rate of the Al-containing adhesive-lattice-buffer layer 12 may be, for example, 0.01 nm/s to 5 nm/s. The argon working pressure may be, for example, $10^{-3}$ torr to $10^{-2}$ torr. The rotation speed of the chuck may be, for example, 1 rpm to 100 rpm. It should be understood that the sputtering process parameters described above may be appropriately adjusted according to practical applications, and are not intended to be limiting.

In accordance with some embodiments, as shown in FIG. 2A, the adhesive-lattice-buffer layer 12 may be formed on the substrate 10 by evaporation coating. In some embodiments, the degree of vacuum of the evaporation coating process may be, for example, $10^{-6}$ torr to $10^{-5}$ torr. The electron beam scanning frequency may be, for example, about 2 Hz. The evaporation coating rate of the Ti-containing adhesive-lattice-buffer layer 12 may be, for example, 0.01 nm/s to 2 nm/s; the evaporation coating rate of the Al-containing adhesive-lattice-buffer layer 12 may be, for example, 0.01 nm/s to 10 nm/s. It should be understood that the evaporation coating process parameters described above may be appropriately adjusted according to practical applications, and are not intended to be limiting.

Referring to FIG. 2B, the diffusion-barrier-reaction layer 18 is formed on the adhesive-lattice-buffer layer 12. In some embodiments, the diffusion-barrier-reaction layer 18 may comprise Ni, Cu, or a combination thereof. In some embodiments, the thickness of the Ni-containing diffusion-barrier-reaction layer 18 may be 0.1 μm to 100 μm. Such as 0.5 μm to 20 μm. In some embodiments, the thickness of the Cu-containing diffusion-barrier-reaction layer 18 may be 0.1 μm to 300 μm, such as 1.0 μm to 100 μm. It should be understood that the thickness of the diffusion-barrier-reaction layer 18 may be appropriately adjusted according to practical applications, and is not intended to be limiting.

In accordance with some embodiments, as shown in FIG. 2B, the diffusion-barrier-reaction layer 18 may be formed on the adhesive-lattice-buffer layer 12 by sputtering. In some embodiments, the sputtering may use single sputtering gun or multiple sputtering guns. In the sputtering process, the power source may be DC, DC plus, RF, or HIPIMS. The power may be, for example, 50 W to 3000 W. The processing temperature may be, for example, −5° C. to 55° C. The argon working pressure may be, for example, $10^{-3}$ torr to $10^{-2}$ torr. The rotation speed of the chuck may be, for example, 1 rpm to 100 rpm. The deposition rate of the Ni-containing diffusion-barrier-reaction layer 18 may be, for example, 0.01 nm/s to 5 nm/s; the deposition rate of the Cu-containing diffusion-barrier-reaction layer 18 may be, for example, 0.01 nm/s to 5 nm/s. It should be understood that the sputtering process parameters described above may be appropriately adjusted according to practical applications, and are not intended to be limiting.

In accordance with other embodiments, as shown in FIG. 2B, the diffusion-barrier-reaction layer 18 may be formed on the adhesive-lattice-buffer layer 12 by evaporation coating. In some embodiments, the degree of vacuum of the evaporation coating process may be, for example, $10^{-6}$ torr to $10^{-5}$ torr. The electron beam scanning frequency may be, for example, about 2 Hz. The evaporation coating rate of the Ni-containing diffusion-barrier-reaction layer 18 may be, for example, 0.01 nm/s to 10 nm/s; the evaporation coating rate of the Cu-containing diffusion-barrier-reaction layer 18 may be, for example, 0.01 nm/s to 10 nm/s. It should be understood that the evaporation coating process parameters described above may be appropriately adjusted according to practical applications, and are not intended to be limiting.

In some embodiments, the diffusion-barrier-reaction layer 18 can prevent the subsequently formed metal layer from diffusing toward the substrate 10, or prevent the adhesive-lattice-buffer layer 12 from diffusing toward the subsequently formed metal layer.

Referring to FIG. 2C, the silver nano-twinned thin film 14 is formed on the diffusion-barrier-reaction layer 18. In some embodiments, for the twin structure of the silver nano-twinned thin film 14, reference may be made to the embodiment shown in FIG. 1B. Thus, it is not repeated again.

In accordance with some embodiments, as shown in FIG. 2C, the silver nano-twinned thin film 14 comprises parallel-stacked silver nano-twinned pillars 16. In some embodiments, for the thickness of the silver nano-twinned thin film 14 and the diameters of the silver nano-twinned pillars 16, reference may be made to the embodiment shown in FIG. 1B. Thus, it is not repeated again. It should be understood that the thickness of the silver nano-twinned thin film 14 and the diameters of the silver nano-twinned pillars 16 may be appropriately adjusted according to practical applications, and are not intended to be limiting.

In accordance with some embodiments, as shown in FIG. 2C, the silver nano-twinned thin film 14 may be formed on the diffusion-barrier-reaction 18 by sputtering. In some embodiments, the sputtering may use single sputtering gun or multiple sputtering guns. In the sputtering process, the power source may be DC, DC plus, RF, or HIPIMS. The power may be, for example, 50 W to 3000 W. The processing temperature may be, for example, $-5°$ C. to $55°$ C. The argon working pressure may be, for example, $10^{-3}$ torr to $10^{-2}$ torr. The rotation speed of the chuck may be, for example, 1 rpm to 100 rpm. The deposition rate of the silver nano-twinned thin film 14 may be, for example, 0.3 nm/s to 15 nm/s. It should be understood that the sputtering process parameters described above may be appropriately adjusted according to practical applications, and are not intended to be limiting.

In accordance with other embodiments, as shown in FIG. 2C, the silver nano-twinned thin film 14 may be formed on the diffusion-barrier-reaction layer 18 by evaporation coating. In some embodiments, the degree of vacuum of the evaporation coating process may be, for example, $10^{-6}$ torr to $10^{-5}$ torr. The electron beam scanning frequency may be, for example, about 2 Hz. The evaporation coating rate of the silver nano-twinned thin film 14 may be, for example, 0.5 nm/s to 20 nm/s. It should be understood that the evaporation coating process parameters described above may be appropriately adjusted according to practical applications, and are not intended to be limiting.

The following describes the formation and detection results of some working examples of the present disclosure in detail.

Preferred Examples 1-3 used (100), (110), and (111) single-crystalline silicon substrates, respectively. The single-crystalline silicon substrate was placed on the chuck of a DC magnetron sputtering machine. The degree of vacuum was below $4.8 \times 10^{-6}$ torr. The rotation speed of the chuck was 10 rpm. The flow rate of argon was between 7 sccm to 15 sccm. The working pressure was between 3 mtorr to 5 mtorr. The power of the machine was between 100 W to 200 W. The temperature was set at room temperature. The temperature of the chuck rose from room temperature to a maximum of $50°$ C. due to ion bombardment. The Ti-containing adhesive-lattice-buffer layer was formed to a thickness of 0.1 μm at a deposition rate of 0.111 nm/s by sputtering. The silver nano-twinned thin film was formed to thickness of 2 μm to 9 μm at a deposition rate between 0.764 nm/s to 1.345 nm/s by sputtering.

Figure 3:
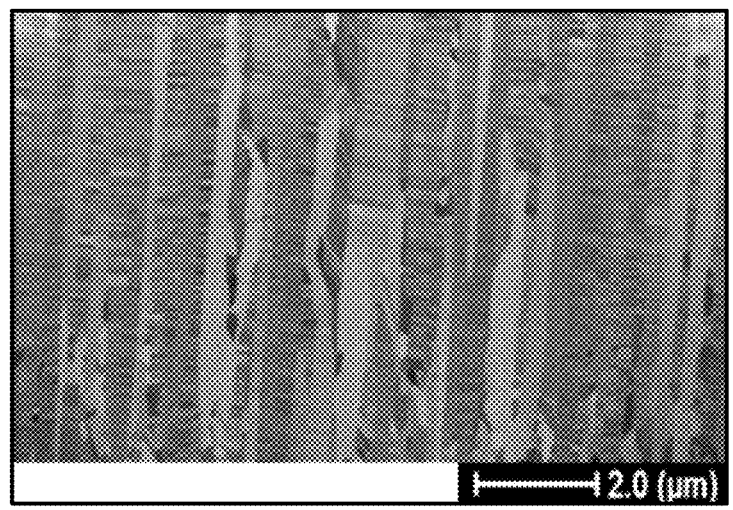
FIG. 3 is a focused ion beam (FIB) image showing a cross-sectional view of a silver nano-twinned thin film formed on a (100) single-crystalline silicon substrate according to some embodiments of the present disclosure.

In accordance with Example 1, FIG. 3 is a focused ion beam (FIB) image showing a cross-sectional view of the silver nano-twinned thin film formed on the (100) single-crystalline silicon substrate. The cross-section of the silver nano-twinned thin film was further analyzed by electron backscatter diffraction (EBSD), which showed that the cross-section of the silver nano-twinned thin film included nano-scale parallel-arranged twin boundaries ($\Sigma 3 + \Sigma 9$). A cross-section of the silver nano-twinned thin film revealed that 64.7% of all twin boundaries are parallel-arranged twin boundaries. Grains with tolerance angle within $15°$ were considered as grains in the same lattice direction. An average distance between twin boundaries was 3.9 nm.

Figure 4:
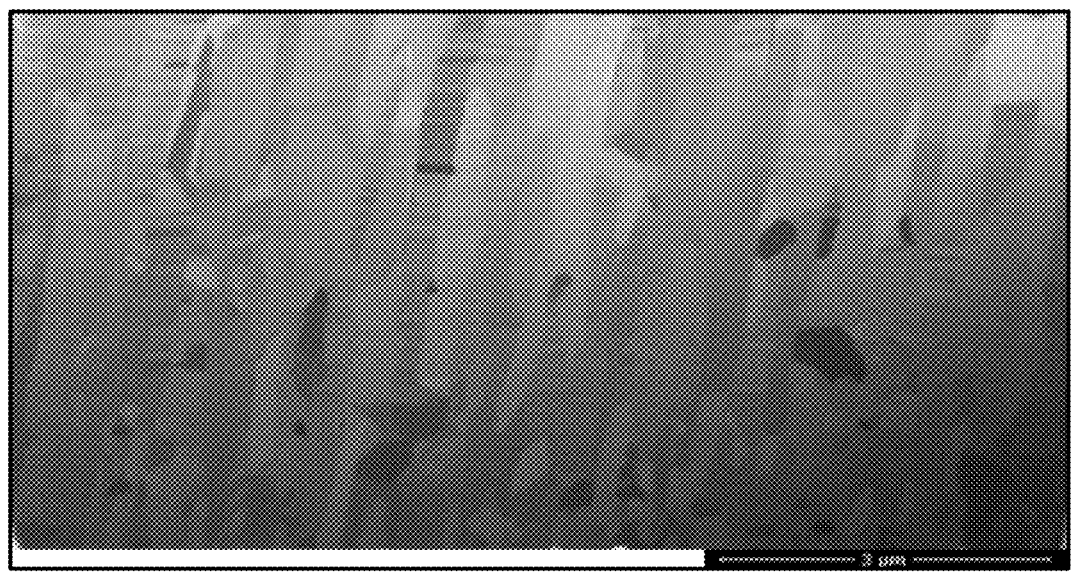
FIG. 4 is a FIB image showing a cross-sectional view of a silver nano-twinned thin film formed on a (110) single-crystalline silicon substrate according to other embodiments of the present disclosure.

In accordance with Example 2, FIG. 4 is a focused ion beam (FIB) image showing a cross-sectional view of the silver nano-twinned thin film formed on the (110) single-crystalline silicon substrate. The cross-section of the silver nano-twinned thin film was further analyzed by EBSD, which showed that the cross-section of the silver nano-twinned thin film included nano-scale parallel-arranged twin boundaries ($\Sigma 3 + \Sigma 9$). A cross-section of the silver nano-twinned thin film reveals that 64.1% of all twin boundaries are parallel-arranged twin boundaries. Grains with tolerance angle within $15°$ were considered as grains in the same lattice direction. An average distance between twin boundaries was 3.2 nm.

Figure 5:
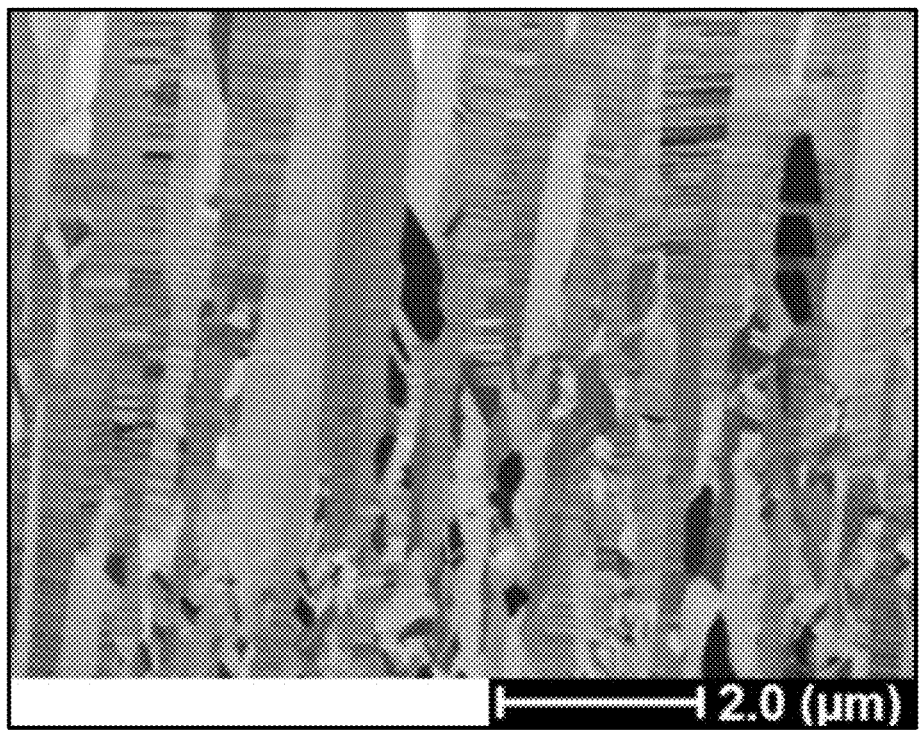
FIG. 5 is a focused ion beam (FIB) image showing a cross-sectional view of a silver nano-twinned thin film formed on a (111) single-crystalline silicon substrate according to other embodiments of the present disclosure.

In accordance with embodiment 3, FIG. 5 is a focused ion beam (FIB) image showing a cross-sectional view of the silver nano-twinned thin film formed on the (111) single-crystalline silicon substrate. The cross-section of the silver nano-twinned thin film was further analyzed by electron backscatter diffraction (EBSD), which showed that the cross-section of the silver nano-twinned thin film included nano-scale parallel-arranged twin boundaries ($\Sigma 3 + \Sigma 9$). A cross-section of the silver nano-twinned thin film reveals that 63.4% of all twin boundaries are parallel-arranged twin boundaries. Grains with tolerance angle within $15°$ were considered as grains in the same lattice direction. An average distance between twin boundaries was 4.8 nm.

Figure 6:
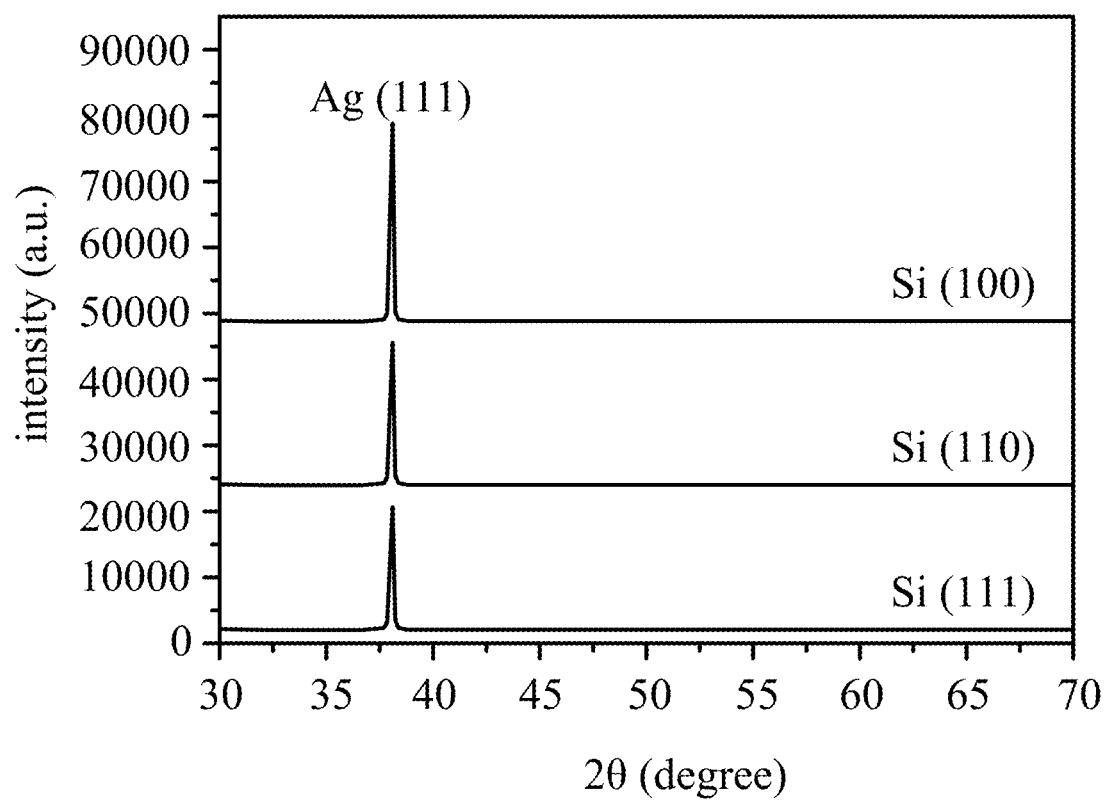
FIG. 6 is an X-ray diffraction (XRD) pattern of silver nano-twinned thin films formed on (100), (110), and (111) single-crystalline silicon substrates respectively according to some embodiments of the present disclosure.

In accordance with the preferred Examples 1-3, FIG. 6 is an X-ray diffraction (XRD) pattern of the silver nano-twinned thin films formed on (100), (110), and (111) single-crystalline silicon substrates, respectively. The preferred Examples 1-3 showed that the parallel-arranged twin boundaries included [111] crystal orientation close to 100%. Compared to the XRD pattern shown in Taiwan Patent No. 1432613, the crystal orientation of Cu was still obvious at (222). In addition, the twin boundaries included only 90% [111] crystal orientation. Compared to the XRD pattern shown in Taiwan Patent No. 1507548, the crystal orientation of Au was still obvious at (222). In addition, the twin boundaries included only 50% [111] crystal orientation.

In accordance with the preferred Examples 1-3, a quantity of silver nano twins formed on the (100) single-crystalline silicon substrate was about 92% of a total quantity of grains in a cross-sectional view of the silver nano-twinned thin film; a quantity of silver nano twins formed on the (110) single-crystalline silicon substrate was about 89% of a total quantity of grains in a cross-sectional view of the silver nano-twinned thin film; a quantity of silver nano twins formed on the (111) single-crystalline silicon substrate was about 78% of a total quantity of grains in a cross-sectional view of the silver nano-twinned thin film. The remaining portions of the silver nano-twinned thin film were slender single-crystalline grains.

In accordance with the preferred Examples 1-3, the adhesive-lattice-buffer layer 12 had the lattice buffering effect on forming the silver nano-twinned thin film 14 on the substrate 10 with different crystal orientation. As shown in FIGS. 3 to 6, whether the silver nano-twinned thin films were formed on the (100), (110), or (111) single-crystalline silicon substrate, all of them had high twin densities. In addition, the densely parallel-arranged nano twins exhibited a [111] crystal orientation close to 100%. Furthermore, the twin boundaries were perpendicular to the direction of growth of the silver nano-twinned thin film.

Figure 7A:
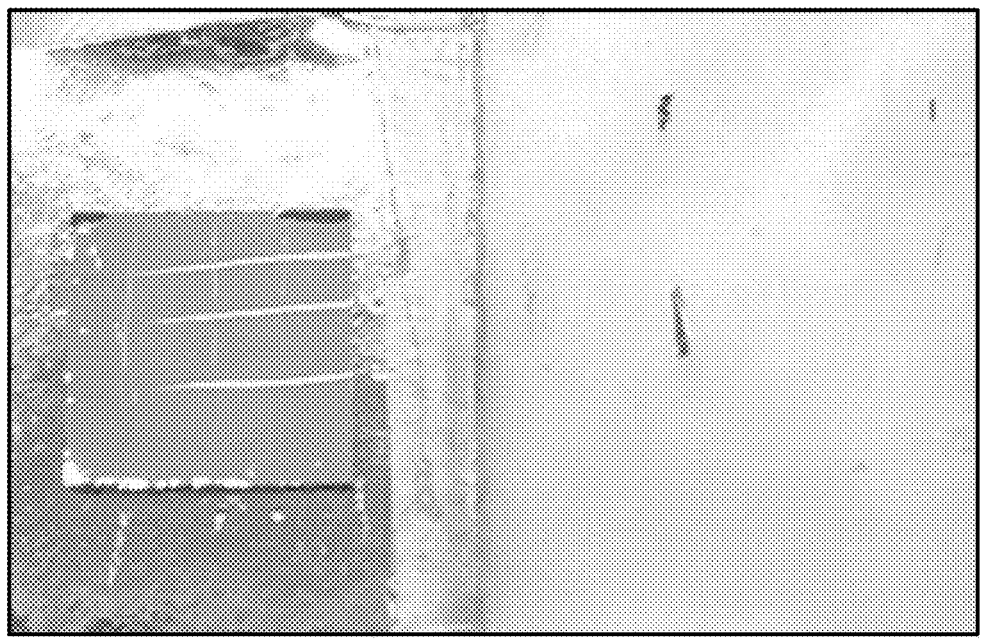
FIG. 7A is a grid peeling test result of a silver nano-twinned thin film formed on a (100) single-crystalline silicon substrate according to some embodiments of the present disclosure.

Referring to FIG. 7A, in Example 4, a Ti-containing adhesive-lattice-buffer layer with a thickness of 0.1 μm was formed by sputtering on the (100) single-crystalline silicon substrate. A silver nano-twinned thin film with a thickness of 2 μm was then formed by sputtering on the Ti-containing adhesive-lattice-buffer layer. A bonding force between the silver nano-twinned thin film and the (100) single-crystalline silicon substrate was tested by grid peeling. As shown in FIG. 7A, the silver nano-twinned thin film substantially remained.

Figure 7B:
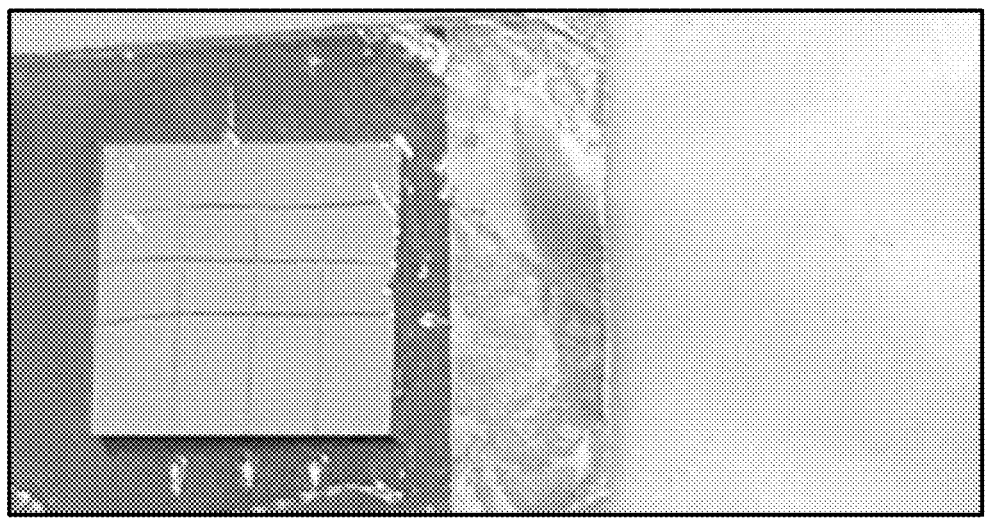
FIG. 7B is a grid tearing test result of a silver nano-twinned thin film formed on a (110) single-crystalline silicon substrate according to other embodiments of the present disclosure.

Referring to FIG. 7B, in Example 5, a Ti-containing adhesive-lattice-buffer layer with a thickness of 0.1 μm was formed by sputtering on the (100) single-crystalline silicon substrate. A silver nano-twinned thin film with a thickness of 8 μm was then formed by sputtering on the Ti-containing adhesive-lattice-buffer layer. A bonding force between the silver nano-twinned thin film and the (100) single-crystalline silicon substrate was tested by grid peeling. As shown in FIG. 7B, the silver nano-twinned thin film substantially remained.

Figure 7C:
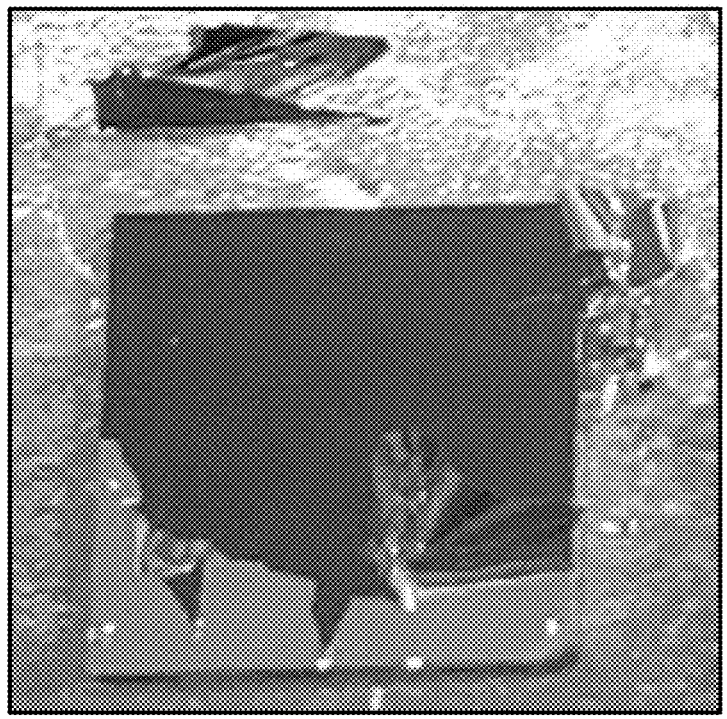
FIG. 7C is a grid tearing test result of a silver nano-twinned thin film formed on a (111) single-crystalline silicon substrate according to other embodiments of the present disclosure.

Referring to FIG. 7C, in Example 6, a silver nano-twinned thin film with a thickness of 2 μm was formed by sputtering directly on the (100) single-crystalline silicon substrate. A bonding force between the silver nano-twinned thin film and the (100) single-crystalline silicon substrate was tested by grid peeling. As shown in FIG. 7A, the silver nano-twinned thin film was substantially peeled.

In accordance with other examples, a silver nano-twinned thin film with a thickness of 8 μm was formed by sputtering directly on the (100) single-crystalline silicon substrate. The silver nano-twinned thin film could easily be peeled off the (100) single-crystalline silicon substrate.

In accordance with Examples 4-6, as shown in FIG. 7A-7C, the adhesive-lattice-buffer layer formed between the single-crystalline silicon substrate and the silver nano-twinned thin film can improve the bonding force between those layers.

In the prior art, the thickness of a nano-twinned thin film may be 200 μm, or even up to 500 μm. However, as the thickness of the nano-twinned thin film is greater than 100 μm, the quality of the nano-twinned thin film may be compromised. Especially, the nano-twinned thin film in particular may peel easily when the nano-twinned thin film is formed directly on the substrate. The bonding force between the substrate and the nano-twinned thin film decreases significantly as the thickness of the nano-twinned thin film exceeds 2 μm. Furthermore, the nano-twinned thin film may be peeled from the substrate.

In the prior art, the thickness of a nano-twinned thin film may be between 0.01 μm to 0.1 μm. However, the nano-twinned thin film with the thickness of less than 0.1 μm will quickly and completely react with the a bonding material during subsequent low-temperature and low-pressure wafer bonding and 3D-IC flip-chip assembly. An intermetallic compound formed at the interface is unable to bond to the substrate, which results in peeling. In other words, it is unable to use in practical application.

The embodiments of present disclosure have some advantageous features. The adhesive-lattice-buffer layer located between the substrate and the silver nano-twinned thin film provides a better bonding force between the substrate and the silver nano-twinned thin film to avoid peeling. The adhesive-lattice-buffer layer also has the lattice buffering effect on reducing the influence of the crystal orientation of the substrate on the epitaxial growth of the silver nano-twinned thin film. The silver nano-twinned thin film includes parallel-arranged twin boundaries and a cross-section of the silver nano-twinned thin film reveals that 50% or more of all twin boundaries are parallel-arranged twin boundaries. Furthermore, the parallel-arranged twin boundaries include 95% or more [111] crystal orientation.

In addition, the resistivity of silver is 1.63 μΩ·cm, which is lower than that of copper (1.69 μΩ·cm), gold (2.2 μΩ·cm), and nickel (6.90 μΩ·cm). The stacking fault energy of silver is 25 mJ/m$^2$, which is also lower than that of copper (70 mJ/m$^2$), gold (45 mJ/m$^2$), and nickel (225 mJ/m$^2$). Therefore, silver is more likely to form twins than copper, gold and nickel. Compared to the conventional technique for forming a copper nano-twinned thin film by electroplating, the diffusion rate of silver is more than 10 times faster than that of copper in the sputtering process for forming nano-twinned thin film of present disclosure. The melting point of silver is about 100° C. lower than that of copper. Therefore, subsequent wafer bonding processes can be performed at a lower temperature. The texture of silver is softer than that of copper. Therefore, silver has less influence on the surface roughness as bonding to other materials subsequently. Furthermore, silver is less susceptible to oxidation than copper. All of these characteristics show that the silver nano-twinned thin film structure of present disclosure has an advantage of practical application, especially for the needs of the semiconductor industry such as low temperature and low pressure wafer bonding and 3D-IC flip chip assembly.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A silver nano-twinned thin film structure, comprising:
   a substrate;
   an adhesive-lattice-buffer layer over the substrate; and
   a silver nano-twinned thin film over the adhesive-lattice-buffer layer, wherein the silver nano-twinned thin film comprises parallel-arranged twin boundaries, and a cross-section of the silver nano-twinned thin film reveals that 50% or more of all twin boundaries are parallel-arranged twin boundaries, wherein the parallel-arranged twin boundaries comprise Σ3 and Σ9 boundaries, wherein the Σ3 and Σ9 boundaries comprise 95% or more [111] crystal orientation.

2. The silver nano-twinned thin film structure as claimed in claim 1, wherein the silver nano-twinned thin film includes silver nano-twinned pillars with a diameter of 0.01 μm to 10 μm.

3. The silver nano-twinned thin film structure as claimed in claim 1, wherein a thickness of the silver nano-twinned thin film is between 0.1 μm and 100 μm.

4. The silver nano-twinned thin film structure as claimed in claim 1, wherein a thickness of the adhesive-lattice-buffer layer is between 0.01 μm and 1 μm.

5. The silver nano-twinned thin film structure as claimed in claim 1, wherein a distance between parallel-arranged twin boundaries is between 1 nm and 100 nm.

6. The silver nano-twinned thin film structure as claimed in claim 1, further comprising a diffusion-barrier-reaction layer between the adhesion-lattice-buffer layer and the silver nano-twinned thin film.

7. The silver nano-twinned thin film structure as claimed in claim 1, wherein the adhesive-lattice-buffer layer comprises Ti, Al, or a combination thereof.

8. The silver nano-twinned thin film structure as claimed in claim 6, wherein the diffusion-barrier-reaction layer comprises Ni, Cu, or a combination thereof.

9. The silver nano-twinned thin film structure as claimed in claim 1, wherein the substrate comprises a single-crystalline silicon substrate, polycrystalline silicon substrate, SiC substrate, GaAs substrate, or glass substrate.

10. The silver nano-twinned thin film structure as claimed in claim 9, wherein the single-crystalline silicon substrate comprises (100), (110), or (111) crystal orientation.

11. A method for forming the silver nano-twinned thin film structure as set forth in claim 1, comprising:

forming the adhesive-lattice-buffer layer on the substrate; and forming the silver nano-twinned thin film on the adhesive-lattice-buffer layer, wherein the silver nano-twinned thin film comprises parallel-arranged twin boundaries, and a cross-section of the silver nano-twinned thin film reveals that 50% or more of all twin boundaries are parallel-arranged twin boundaries, wherein the parallel-arranged twin boundaries comprise $\Sigma 3$ and $\Sigma 9$ boundaries, wherein the $\Sigma 3$ and $\Sigma 9$ boundaries comprise 95% or more [111] crystal orientation.

12. The method as claimed in claim 11, wherein the adhesive-lattice-buffer layer and the silver nano-twinned thin film are formed by sputtering or evaporation coating.

13. The method as claimed in claim 11, further comprising forming a diffusion-barrier-reaction layer between the adhesive-lattice-buffer layer and the silver nano-twinned thin film by sputtering or evaporation coating.

14. The method as claimed in claim 11, wherein the substrate comprises a single-crystalline silicon substrate, polycrystalline silicon substrate, SiC substrate, GaAs substrate, or glass substrate.

15. The method as claimed in claim 14, wherein the single-crystalline silicon substrate comprises (100), (110), or (111) crystal orientation.

* * * * *